(12) United States Patent
Fujiwara (10) Patent No.: US 7,174,501 B2
(45) Date of Patent: Feb. 6, 2007

(54) APPARATUS AND METHOD OF CORRECTING OFFSET

(75) Inventor: Tsuneo Fujiwara, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 362 days.

(21) Appl. No.: 10/686,472

(22) Filed: Oct. 14, 2003

(65) Prior Publication Data

US 2004/0078748 A1 Apr. 22, 2004

(30) Foreign Application Priority Data

Oct. 15, 2002 (JP) .............................. 2002-300491

(51) Int. Cl.
*H03M 13/03* (2006.01)

(52) U.S. Cl. ...................... 714/795; 714/794; 714/796; 714/792; 375/262; 375/341; 375/265

(58) Field of Classification Search ........ 714/791–792, 714/796–794; 375/262, 265, 341
See application file for complete search history.

(56) References Cited

FOREIGN PATENT DOCUMENTS

| JP | 06-243598 | 9/1994 |
| JP | 06-325504 | 11/1994 |
| JP | 07-122000 | 5/1995 |
| JP | 09-245436 | 9/1997 |
| JP | 10-021651 | 1/1998 |
| JP | 10-038606 | 2/1998 |
| JP | 10-172238 | 6/1998 |

*Primary Examiner*—Guy J. Lamarre
(74) *Attorney, Agent, or Firm*—David G. Conlin; William J. Daley, Jr.; Edwards Angell Palmer & Dodge (57) ABSTRACT

An apparatus for correcting offset includes an optical pickup converting data recorded on an optical disc to an electrical signal; an AD converter quantizing a reproduction signal for each clock in synchronization with a bit period of the reproduction signal and sequentially outputting the signal as a quantized data column for each clock; an adder adding an offset adjustment amount to the quantized data column serving as an input signal; a Viterbi decoder performing Viterbi decoding on the signal after offset adjustment for binarization; and an offset correction value operating unit calculating the offset adjustment amount so that a value obtained by dividing a standard deviation of path metric difference between a survivor path and another path merged into the survivor path in the Viterbi decoder by an average of the path metric difference is minimized.

20 Claims, 8 Drawing Sheets

APPARATUS AND METHOD OF CORRECTING OFFSET

BACKGROUND OF THE INVENTION

1. Field of the Invention

The present invention relates to a technique to reproduce data on a recording medium, and more particularly to an offset correction technique for appropriately controlling a low frequency signal added to an input signal.

2. Description of the Background Art

In recent years, a disc apparatus with high density and large capacity such as a magnetic disc apparatus or an optical disc apparatus represented by a DVD (Digital Versatile Disc) has actively been studied and developed. Since such a disc apparatus has achieved higher density, a PRML (Partial Response Maximum Likelihood) detecting scheme has become indispensable as a signal processing technique for improving an error rate of reproduced data. It is well-known that this scheme combining partial response waveform equalization with maximum likelihood detection considers the frequency property from a disc to an input of a maximum likelihood detector as a "coder", and corrects a reproduction signal with waveform equalization followed by decoding with maximum likelihood detection.

PRML detection is particularly effective in a case in which, when information highly densely recorded on an optical disc is reproduced, intersymbol interference becomes significant to lower reproduction amplitude in high frequency, and the SN ratio of a high-frequency component of the reproduction signal is deteriorated to aggravate the error rate. In the maximum likelihood detection scheme, a pattern minimizing a total sum of a square error with respect to an error between input data and an ideal expected value obtained from a property of the coder is selected from all patterns, with respect to an amplitude information column input to the maximum likelihood detector and having approximately 8-bit quantized bit number, for example. Meanwhile, it is difficult to perform a processing described above in an actual circuit in terms of a circuit size and an operation speed. Therefore, the processing is usually performed with the use of an algorithm called "Viterbi decoding."

As an example of PRML detection combining partial response waveform equalization with Viterbi decoding as above, Japanese Patent Laying-Open No. 6-243598 proposes PRML detection using PR (1, 2, 1) property with a ratio (1:2:1) of impulse response of an isolated mark assumed by a Viterbi decoder.

On the other hand, data recorded on the optical disc is normally coded in advance by an RLL (Run Length Limited) code as a recording code. A variety of codes have been proposed, and in summary, the feature consists in limiting the number of 0s located between 1s. This limitation is generally called (d, k) limitation and denoted by (d, k) RLL code or the like. The (d, k) limitation means that the number of 0s located between 1s never fails to be not smaller than d and not larger than k. Normally, after the data is modulated to the RLL code, it is further subjected to NRZI conversion. The NRZI conversion is a scheme to invert 1 every time 1 is detected in the data prior to NRZI conversion. By combining NRZI conversion with (d, k) RLL, a minimum inversion interval is set to (d+1), while a maximum inversion interval is set to (k+1). In an example of (1, 7) RLL code where d=1 and k=7, the number of 0s located between 1s is not smaller than 1 and not larger than 7. Therefore, after NRZI conversion, the minimum inversion interval is set to 2, and the maximum inversion interval is set to 8. A detection scheme combining limitation of the minimum inversion interval with PRML detection is extremely effective as a scheme attaining further improvement in a decode error rate. Japanese Patent Laying-Open No. 7-122000 shows a detection scheme combining a property of the minimum inversion interval not smaller than 2 with PRML detection using PR (1, 2, 1).

Though Viterbi decoding (maximum likelihood decoding) above is highly effective means to enable recovering of SN deterioration, it is effective only for an example in which white noise is superposed on the reproduction signal. Performance is considerably deteriorated when direct-current level fluctuation, that is, a low-frequency noise is caused, as in a normal binary detection scheme.

The direct-current level fluctuation, that is, the low-frequency noise is attributed, for example, to a disc substrate or a medium, or to removal of a low-frequency component in the recording code such as (d, k) RLL code+NRZI conversion by a high pass filter within a signal reproduction system. In addition, occurrence of duty deviation of a mark on a disc, namely what is called "asymmetry", also causes the direct-current level fluctuation.

Several techniques to avoid deterioration of Viterbi decoding performance due to the direct-current level fluctuation have conventionally been proposed. For example, a scheme shown in Japanese Patent Laying-Open No. 6-325504, aiming to prevent deterioration of the performance of the Viterbi decoder due to the direct-current level fluctuation, detects a transition pattern that a level of the reproduction signal varies across a center level, and uses amplitude data in that pattern to correct direct-current offset.

In addition, in a scheme shown in Japanese Patent Laying-Open No. 10-172238, an error between an input sample value and a reference level is detected, and information from a Viterbi detector is used to extract the error corresponding to a survivor path (selected path) of Viterbi decoding. Then, an average of n errors is employed as a direct-current offset correction value.

Figure 7:
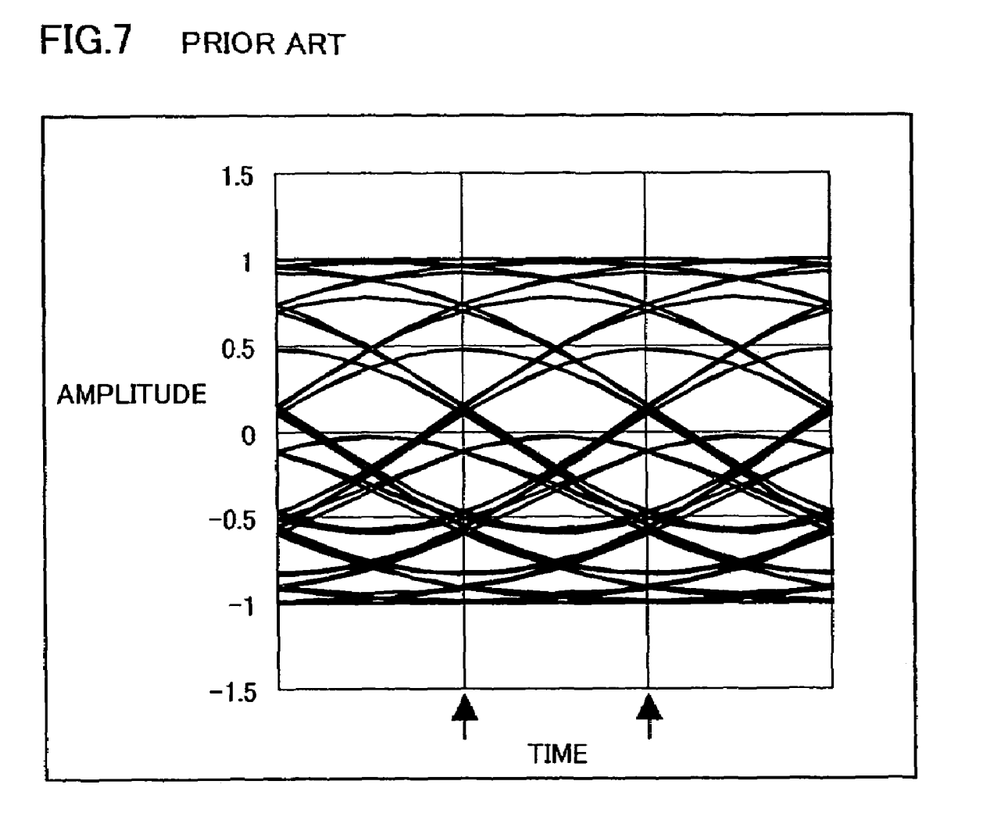
FIG. 7 is an eye pattern illustrating a problem to be solved by the present invention.
Figure 8:
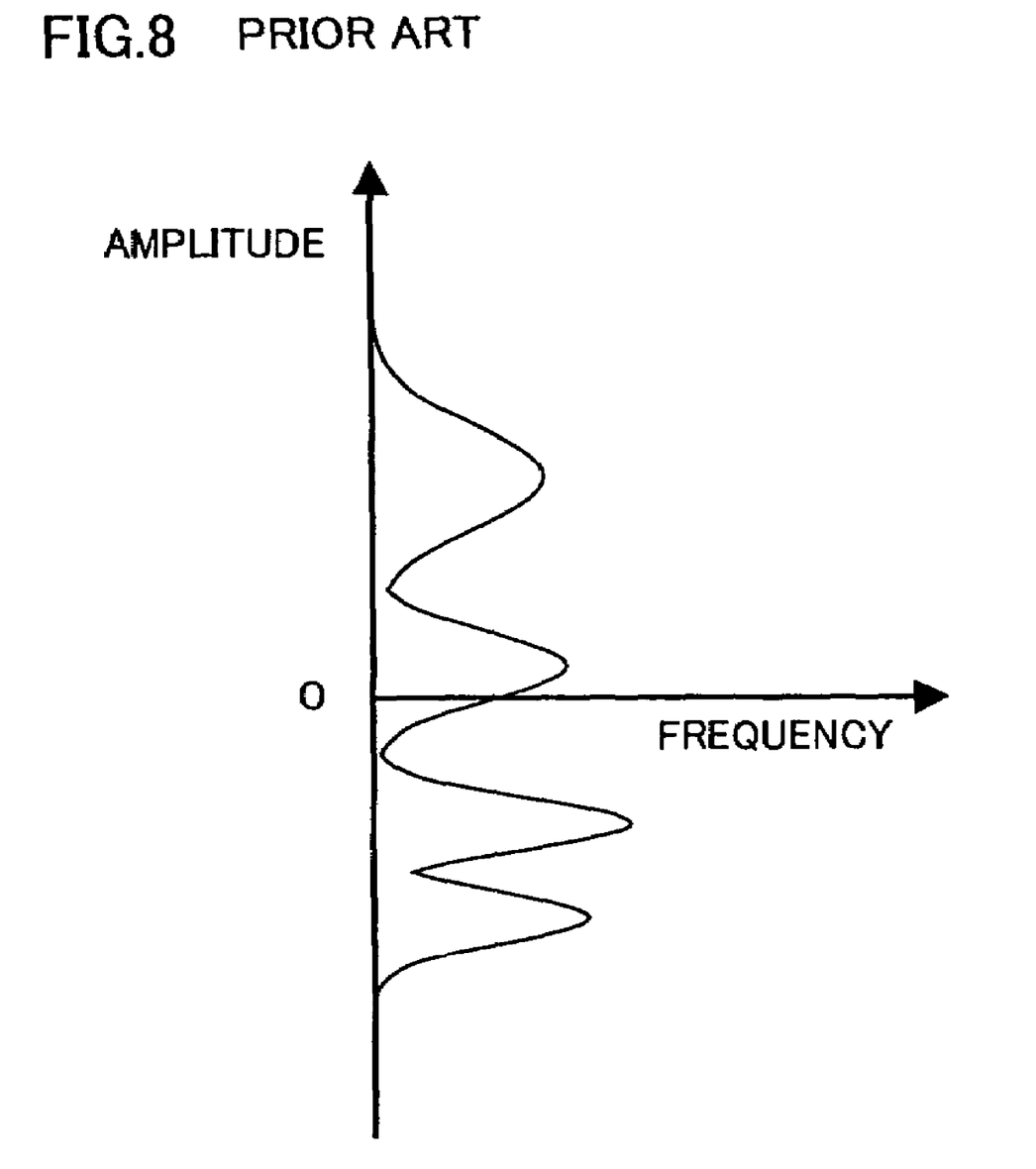
FIG. 8 is a histogram of an amplitude of quantized data for illustrating the problem to be solved by the present invention.

If the duty deviation of the mark on the disc, namely what is called "asymmetry", is causing the direct-current level fluctuation, apparently, a difference between a proportion of a direct-current component superposed on a high-frequency signal and a proportion of a direct-current component superposed on a low-frequency signal is created. Moreover, as a signal has a higher frequency, the direct-current level tends to be shifted. Accordingly, an eye pattern exhibits a waveform in which the center of the eye is deviated from the amplitude center, as shown in FIG. 7. In an example in which the white noise is superposed on such a reproduction signal, when the reproduction signal is quantized at a timing indicated with an arrow in FIG. 7, it is observed in an amplitude histogram that each crest of the histogram apparently has a separate offset, as can be seen in FIG. 8.

When an attempt is made for offset correction of such a signal, the schemes disclosed in Japanese Patent Laying-Open No. 6-325504 and Japanese Patent Laying-Open No. 10-172238 do not consider the direct-current offset deviation due to asymmetry. Therefore, optimal direct-current offset adjustment has not been attained.

SUMMARY OF THE INVENTION

An object of the present invention is to provide an apparatus and a method of correcting offset, for performing control so that a direct-current offset value is attained so as to achieve a substantially best error rate after Viterbi decoding.

Another object of the present invention is to provide an apparatus and a method of correcting offset with a simplified configuration, for achieving a substantially best error rate after Viterbi decoding.

An apparatus for correcting offset according to the present invention includes: an offset adjustment unit for adding an offset adjustment amount to an input signal; a Viterbi decoding unit for subjecting the input signal after offset adjustment is performed by the offset adjustment unit to Viterbi decoding for binarization; and a calculating unit connected to the offset adjustment unit and the Viterbi decoding unit, for calculating an offset adjustment amount so that a value obtained by dividing a standard deviation of path metric difference between a survivor path and another path merged into the survivor path in the Viterbi decoding unit by an average of the path metric difference is minimized.

The calculating unit can calculate the offset adjustment amount so as to attain a substantially best error even if direct-current level fluctuation is caused by any factor such as asymmetry or the like. Consequently, an apparatus for correcting offset capable of direct-current offset correction can be provided.

Preferably, the calculating unit includes a unit for calculating an offset adjustment amount by subtracting, from a current offset adjustment amount, a value obtained by multiplying by a prescribed coefficient an instantaneous differential value of a value obtained by dividing the standard deviation of path metric difference between the survivor path and another path by the average of the path metric difference.

The calculating unit calculates the offset adjustment amount so that the value obtained by dividing the standard deviation of path metric difference between two paths merging in the Viterbi decoding unit by the average of the path metric difference is minimized. In other words, the calculating unit is used to select a prescribed coefficient, whereby a bandwidth for offset correction can be designed to a desired value. Consequently, an apparatus for correcting offset with a simplified configuration and capable of direct-current offset correction can be provided.

More preferably, a recording code of an original bit column of the input signal has a minimum inversion interval of at least 2, a ratio of impulse response of an isolated mark assumed by the Viterbi decoding unit is set to (1:2:1), and an expected value of the Viterbi decoding unit is set to $-\alpha$, $-0.5\alpha$, $+0.50\alpha$, $+\alpha$ assuming $\alpha$ as a prescribed constant. When current input data, input data preceding by 1 sample, and input data preceding by 2 samples are denoted by $y_i$, $y_{i+1}$, $y_{i+2}$ respectively, the path metric difference between the survivor path and another path is calculated by $\pm\alpha(y_{i-2}+2y_{i-1}+y_i)$.

With a simplified configuration, the path metric difference between the two paths merging in the Viterbi decoding unit can be calculated.

More preferably, the calculating unit includes a unit for calculating the offset adjustment amount so as to satisfy $x_{i+1}=x_i-k(8x_i+a+3b+3c+d)$, where a current adjustment amount, an adjustment amount after adjustment, a latest input signal corresponding to a Viterbi decoding expected value $-\alpha$, a latest input signal corresponding to $-0.5\alpha$, a latest input signal corresponding to $+0.5\alpha$, a latest input signal corresponding to $+\alpha$, and a prescribed constant are denoted by $x_i$, $x_{i+1}$, a, b, c, d, and k respectively.

With a simplified configuration, the standard deviation of the path metric difference between the two paths merging in the Viterbi decoding unit can be used to calculate the offset adjustment amount.

More preferably, the calculating unit includes a unit for calculating the offset adjustment amount so as to satisfy $x=-(A+3B+3C+D)/8$, where an adjustment amount, an input signal corresponding to Viterbi decoding expected value $-\alpha$ after passing through a high frequency cutoff filter, an input signal corresponding to $-0.5\alpha$ after passing through a high frequency cutoff filter, an input signal corresponding to $+0.5\alpha$ after passing through a high frequency cutoff filter, and an input signal corresponding to $+\alpha$ after passing through a high frequency cutoff filter are denoted by x, A, B, C, and D respectively.

With a configuration employing a high frequency cutoff filter, the standard deviation of the path metric difference between the two paths merging in the Viterbi decoding unit can be used to calculate the offset adjustment amount.

More preferably, the apparatus for correcting offset further includes a low frequency cutoff filter connected to a preceding stage of the offset adjustment unit.

Offset is corrected so as to compensate a low-frequency component of a code lost by the low frequency cutoff filter. An operation as if solely the low-frequency noise of the reproduction signal had been removed can be achieved, and a decode error can further be decreased.

A method of correcting offset according to another aspect of the present invention includes the steps of: adjusting offset by adding an offset adjustment amount to an input signal; performing Viterbi decoding on the input signal after offset adjustment in the offset adjustment step for binarization; and calculating an offset adjustment amount so that a value obtained by dividing a standard deviation of path metric difference between a survivor path and another path merged into the survivor path in the Viterbi decoding step by an average of the path metric difference is minimized.

In the calculating step, the offset adjustment amount can be calculated so as to attain a substantially best error even if direct-current level fluctuation is caused by any factor such as asymmetry or the like. Consequently, a method of correcting offset capable of direct-current offset correction can be provided.

Preferably, the calculating step includes the step of calculating an offset adjustment amount by subtracting, from a current offset adjustment amount, a value obtained by multiplying by a prescribed coefficient an instantaneous differential value of a value obtained by dividing the standard deviation of path metric difference between the survivor path and another path by the average of the path metric difference.

In the calculating step, the offset adjustment amount is calculated so that a value obtained by dividing the standard deviation of path metric difference between two paths merging in the Viterbi decoding unit by the average of the path metric difference is minimized. In other words, in the calculating step, by selecting a prescribed coefficient, a bandwidth for offset correction can be designed to a desired value. Consequently, with a simplified configuration, a method of correcting offset capable of direct-current offset correction can be provided.

More preferably, a recording code of an original bit column of the input signal has a minimum inversion interval of at least 2, a ratio of impulse response of an isolated mark assumed in the Viterbi decoding step is set to (1:2:1), and expected value in the Viterbi decoding step is set to $-\alpha$, $-0.5\alpha$, $+0.5\alpha$, $+\alpha$ assuming $\alpha$ as a prescribed constant.

When current input data, input data preceding by 1 sample, and input data preceding by 2 samples are denoted by $y_i$, $y_{i-1}$, $y_{i-2}$ respectively, the path metric difference between the survivor path and another path is calculated by $\pm\alpha(y_{i-2}+2y_{i-1}+y_i)$.

With a simplified configuration, the path metric difference between the two paths merging in the Viterbi decoding step can be calculated.

More preferably, the calculating step includes the step of calculating the offset adjustment amount so as to satisfy $x_{i+1}=x_i-k(8x_i+a+3b+3c+d)$, where a current adjustment amount, an adjustment amount after adjustment, a latest input signal corresponding to Viterbi decoding expected value $-\alpha$, a latest input signal corresponding to $-0.5\alpha$, a latest input signal corresponding to $+0.5\alpha$, a latest input signal corresponding to $+\alpha$, and a prescribed constant are denoted by $x_i$, $x_{i+1}$, a, b, c, d, and k respectively.

With a simplified configuration, the standard deviation of the path metric difference between the two paths merging in the Viterbi decoding step can be used to calculate the offset adjustment amount.

More preferably, the calculating step includes the step of calculating the offset adjustment amount so as to satisfy $x=-(A+3B+3C+D)/8$, where an adjustment amount, an input signal corresponding to. Viterbi decoding expected value $-\alpha$ after passing through a high frequency cutoff filter, an input signal corresponding to $-0.5\alpha$ after passing through a high frequency cutoff filter, an input signal corresponding to $+0.50\alpha$ after passing through a high frequency cutoff filter, and an input signal corresponding to $+\alpha$ after passing through a high frequency cutoff filter are denoted by x, A, B, C, and D respectively.

With the use of a high frequency cutoff filter, the standard deviation of the path metric difference between the two paths merging in the Viterbi decoding step can be used to calculate the offset adjustment amount.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the figures. It is noted that the same reference characters refer to the same or corresponding components in the figures, and their notations and functions are also the same. Therefore, description thereof will not be repeated.

First Embodiment

In the following, a first embodiment of the present invention will be described with reference to the figures.

Figure 1:
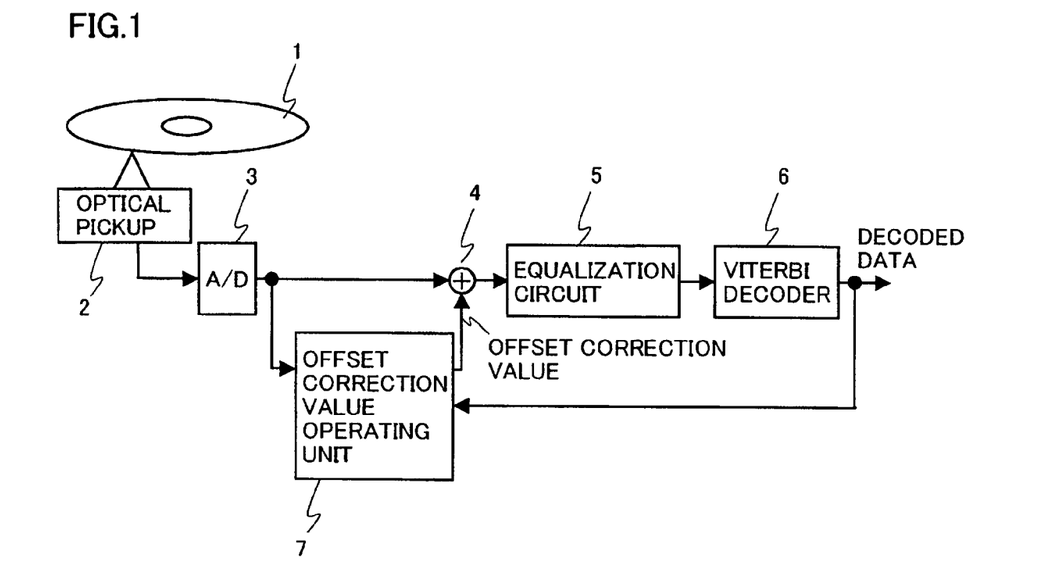
FIG. 1 is a block diagram showing an embodiment of the present invention.

FIG. 1 is a block diagram showing a configuration of an apparatus for correcting offset according to the present embodiment. In FIG. 1, data recorded on an optical disc 1 is converted to an electrical signal by an optical pickup 2 and input to an AD converter 3. AD converter 3 quantizes a reproduction signal for each clock in synchronization with a bit period of the reproduction signal, and the signal is sequentially output for each clock as a quantized data column. Namely, a block provided subsequently to AD converter 3 serves as a digital circuit operating for each clock. Offset of an output of AD converter 3, that is, the quantized data column is corrected by an adder 4 for adjusting direct-current offset, and a frequency property thereof is corrected by an equalization circuit 5. The output of AD converter 3 is then input to a Viterbi decoder and subjected to maximum likelihood decoding for binarization by a Viterbi decoder 6.

The binarization data (decoded data) is output as decoded data to a high-order device (not shown) and concurrently input to an offset correction value operating unit 7. In addition, the quantized data column before offset correction is also input to offset correction value operating unit 7. Offset correction value operating unit 7 uses these inputs to operate an offset correction value and outputs the value to adder 4. Adder 4 adjusts the direct-current offset so as to attain a substantially best error rate. The present invention is characterized by a configuration of offset correction value operating unit 7.

In the following, though detailed configuration of offset correction value operating unit 7 will be described, development of the configuration of the present invention so far will be described first, referring to derivation of algorithm.

[Derivation of Algorithm]

In a process of deriving a method of operating an offset correction value attaining the best error rate after Viterbi decoding, a concept called SAM (Sequenced Amplitude Margin) is employed. For example, the SAM can be operated with a circuit with a simplified configuration, called "metric margin". The SAM is the difference between the path metric of the survivor path and the path metric of another path merged into the survivor path. As the difference is larger, the survivor path has been determined with a larger margin. Namely, the probability of the decode error is lower. Therefore, the SAM is useful as an evaluation indicator substituting the error rate.

Figure 5:
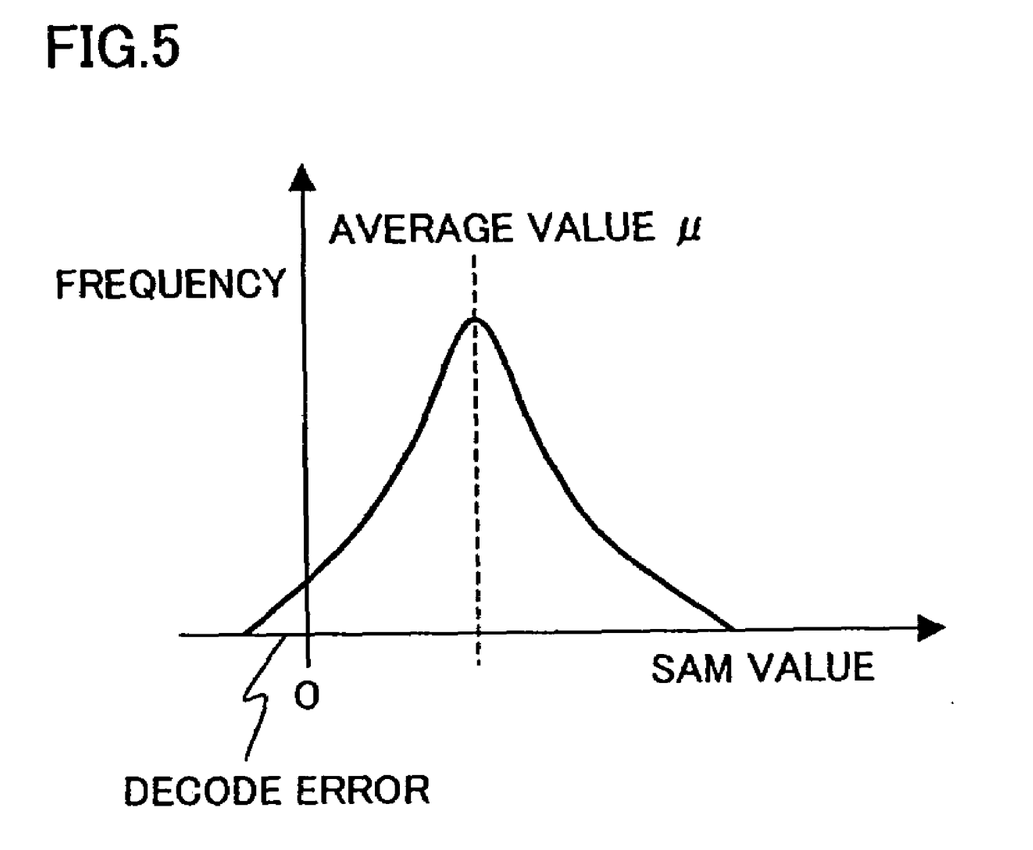
FIG. 5 is a histogram of SAM values for illustrating the SAM.

The SAM exhibits a distribution as shown in FIG. 5 with respect to the reproduction signal having noise superposed. By finding the probability that the value of the SAM becomes negative, an approximate decode error rate can be obtained. Therefore, the smaller the standard deviation $\sigma$ (or variance $\sigma^2$) of the distribution of the SAM is, the better the error rate is. Though an average $\mu$ of the SAM varies depending on the amplitude of the reproduction signal, standard deviation $\sigma$ becomes larger with the increase of average $\mu$, and yet the probability that the SAM becomes negative hardly changes. Therefore, the present algorithm is assumed as a scheme for controlling the direct-current offset so as to minimize a value obtained by dividing standard deviation σ of the SAM shown in [Equation 1] by average μ of the SAM shown in [Equation 2], that is, to minimize [Equation 3].

$$\sigma^2 = \frac{\sum_{i=1}^{n} SAM_i^2 - \frac{\left(\sum_{i=1}^{n} SAM_i\right)^2}{n}}{n} \quad \text{[Equation 1]}$$

$$\mu^2 = \left(\frac{\sum_{i=1}^{n} SAM_i}{n}\right)^2 \quad \text{[Equation 2]}$$

$$\left(\frac{\sigma}{\mu}\right)^2 = \frac{n}{\left(\sum_{i=1}^{n} SAM_i\right)^2} \cdot \sum_{i=1}^{n} SAM_i^2 - 1 \quad \text{[Equation 3]}$$

[Simplified Method of Calculating SAM]

Though algorithm derivation of the present invention uses a concept of the SAM, it does not use the SAM obtained by a normal operation but the simplified SAM shown below. The simplified SAM refers to a method of operating an SAM assuming that an only one error pattern is provided for a correct pattern, when limited to a specific pattern.

In the following, a process of deriving the present algorithm will be described, specifically considering a simplified SAM in Viterbi decoding assuming that the minimum inversion interval of the recording code is set to at least 2 and the PR property is set to PR (1, 2, 1).

In Viterbi decoding assuming that the minimum inversion interval of the recording code is set to at least 2 and the PR property is set to PR (1, 2, 1), the simplified SAM can be considered with respect to four patterns in the following, assuming that a pattern obtained by decoding without an error is represented as a correct pattern while a pattern with an error is represented as an error pattern.

(When Correct Pattern is set to "00111")

In the following, the simplified SAM of this pattern is denoted by SAM1. The error pattern in this case is assumed as "00011".

Here, an ideal input expected by the Viterbi decoder with respect to the correct pattern (expected value) is $[-\alpha, -\alpha, -0.5\alpha, +0.5\alpha, +\alpha]$. Therefore, a path metric Pt of the correct pattern is expressed as below, when a path metric preceding Pt is denoted by P, a current input of the Viterbi decoder is denoted by $y_i$, a Viterbi decoder input preceding by 1 clock is denoted by $y_{i-1}$, a Viterbi decoder input preceding by 2 clocks is denoted by $y_{i-2}$, a Viterbi decoder input preceding by 3 clocks is denoted by $y_{i-3}$, and a Viterbi decoder input preceding by 4 clocks is denoted by $y_{i-4}$.

$$Pt = P + (-\alpha - y_{i-4})^2 + (-\alpha - y_{i-3})^2 + (-0.5\alpha - y_{i-2})^2 + (0.5\alpha - y_{i-1})^2 + (\alpha - y_i)^2 \quad \text{[Equation 4]}$$

On the other hand, the expected value for the error pattern is $[-\alpha, -\alpha, -\alpha, -0.5\alpha, +0.5\alpha]$. Therefore, when the path metric of the error pattern is denoted by Pe, Pe is expressed as below.

$$Pe = P + (-\alpha - y_{i-4})^2 + (-\alpha - y_{i-3})^2 + (-\alpha - y_{i-2})^2 + (-0.5\alpha - y_{i-1})^2 + (0.5\alpha - y_i)^2 \quad \text{[Equation 5]}$$

Accordingly, the following relation is established.

$$SAM1_i = Pe - Pt = \alpha(y_{i-2} + 2y_{i-1} + y_i) \quad \text{[Equation 6]}$$

Here, when an offset correction value is denoted by x, quantized data before superposition of current offset is denoted by $u_i$, quantized data before superposition of offset preceding by 1 clock is denoted by $u_{i-1}$, and quantized data before superposition of offset preceding by 2 clocks is denoted by $u_{i-2}$, the following equation is obtained.

$$SAM1_i = \alpha\{(u_{i-2}+x) + 2(u_{i-1}+x) + (u_i+x)\} = 4\alpha x + \alpha(u_{i-2} + 2u_{i-1} + u_i) \quad \text{[Equation 7]}$$

Figure 6:
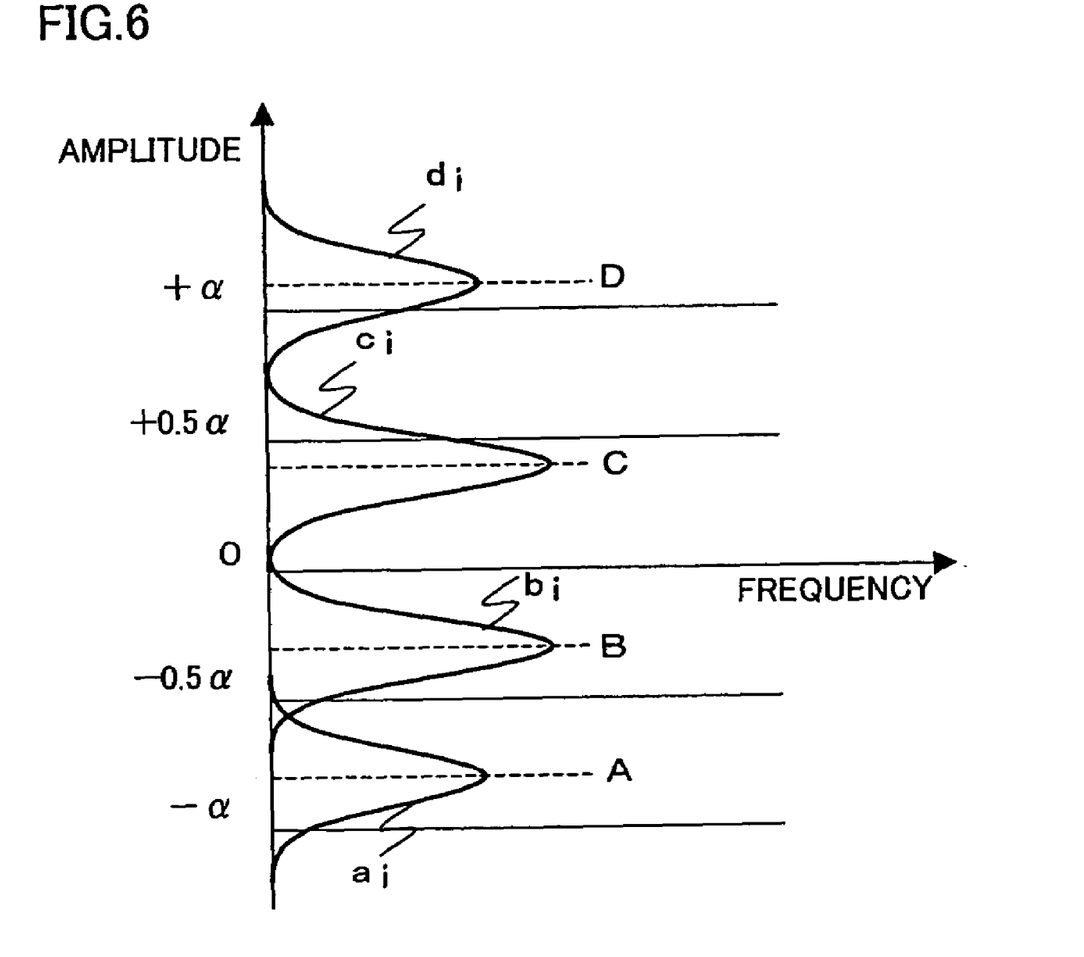
FIG. 6 is a histogram of an amplitude of quantized data for illustrating derivation of an algorithm of the present invention.

In an ideal state, a value which should originally be set to $-\alpha$ is denoted by $a_i$, a value which should originally be set to $-0.5\alpha$ is denoted by $b_i$, a value which should originally be set to $+0.5\alpha$ is denoted by $c_i$, and a value which should originally be set to $+\alpha$ is denoted by $d_i$. These values $a_i$, $b_i$, $c_i$, $d_i$ exhibit a distribution in which their averages attain A, B, C, D respectively due to noise or the like, as in the amplitude histogram of the quantized data column shown in FIG. 6.

If the SAM1 pattern is known, the following relations are established.

$$u_{i-2} = b_i, \, u_{i-1} = c_i, \, u_i = d_i \quad \text{[Equation 8]}$$

Therefore, the following equation is obtained.

$$SAM1_i = 4\alpha x + \alpha(u_{i-2} + 2u_{i-1} + u_i) = 4\alpha x + \alpha(b_i + 2c_i + d_i) \quad \text{[Equation 9]}$$

(When Correct Pattern is set to "11100")

In the following, the simplified SAM of this case is denoted by SAM2 When the error pattern in this case is assumed as "11000", the expected value for the correct pattern is $[+\alpha, +\alpha, +\alpha, +0.5\alpha, -0.5\alpha]$, while the expected value of the error pattern is $[+\alpha, +\alpha, +0.5\alpha, -0.5\alpha, -\alpha]$. Therefore, the following equation can be obtained in a similar manner.

$$SAM2_i = \alpha(y_{i-2} + 2y_{i-1} + y_i) = 4\alpha x + \alpha(b_i + 2c_i + d_i) \quad \text{[Equation 10]}$$

(When Correct Pattern is set to "00011")

In the following, the simplified SAM of this case is denoted by SAM3. When the error pattern in this case is assumed as "00111", the expected value for the correct pattern is $[-\alpha, -\alpha, -\alpha, -0.5\alpha, +0.5\alpha]$, while the expected value of the error pattern is $[-\alpha, -\alpha, -0.5\alpha, +0.5\alpha, +\alpha]$. Therefore, the following equation can be obtained in a similar manner.

$$SAM3_i = -\alpha(y_{i-2} + 2y_{i-1} + y_i) = -\{4\alpha x + \alpha(a_i + 2b_i + c_i)\} \quad \text{[Equation 11]}$$

(When Correct Pattern is set to "11000")

In the following, the simplified SAM of this case is denoted by SAM4. When the error pattern in this case is assumed as "11100", the expected value for the correct pattern is $[+\alpha, +\alpha, +0.5\alpha, -0.5\alpha, -\alpha]$, while the expected value of the error pattern is $[+\alpha, +\alpha, +\alpha, +0.5\alpha, -0.5\alpha]$. Therefore, the following equation can be obtained in a similar manner.

$$SAM4_i = -\alpha(y_{i-2} + 2y_{i-1} + y_i) = -\{4\alpha x + \alpha(a_i + 2b_i + c_i)\} \quad \text{[Equation 12]}$$

[Derivation of Algorithm Using Simplified SAM]

When considering the SAM limiting to the simplified SAM, the SAM includes SAM1, SAM2, SAM3, and SAM4. Here, the probability of appearance of the respective four patterns is substantially the same. Therefore, addition of n SAMs as in [Equation 13] can be considered as addition of n/4 (SAM1+SAM2+SAM3+SAM4).

$$\sum_{i=1}^{n} SAM_i = \sum_{i=1}^{n/4} (SAM1_i + SAM2_i + SAM3_i + SAM4_i) \quad \text{[Equation 13]}$$

Meanwhile, an average of a is A, an average of b is B, an average of c is C, and an average of d is D. Accordingly, the following relation is established.

$$\sum_{i=1}^{n/4} a_i = \frac{n}{4}A, \quad \sum_{i=1}^{n/4} b_i = \frac{n}{4}B, \quad \sum_{i=1}^{n/4} c_i = \frac{n}{4}C, \quad \sum_{i=1}^{n/4} d_i = \frac{n}{4}D \quad \text{[Equation 14]}$$

These equations can be summarized by transformation as shown in [Equation 15]. Here, [Equation 15] becomes a constant term not having x, and x minimizing [Equation 3] is equivalent to x minimizing variance $\sigma^2$ of the SAM ([Equation 1]).

$$\sum_{i=1}^{n} SAM_i = \frac{n\alpha}{2}(-A - B + C + D) \quad \text{[Equation 15]}$$

On the other hand, addition of n (square of SAM) can be considered as addition of n/4 {(square of SAM1)+(square of SAM2)+(square of SAM3)+(square of SAM4)}. As SAM1 is equal to SAM2 and SAM3 is equal to SAM4, transformation and summarization as shown in [Equation 16] is possible.

$$\begin{aligned}
\sum_{i=1}^{n} SAM_i^2 &= \sum_{i=1}^{n/4} (SAM1_i^2 + SAM2_i^2 + SAM3_i^2 + SAM4_i^2) \\
&= \sum_{i=1}^{n/4} (SAM1_i^2 + SAM3_i^2) + \sum_{i=1}^{n/4} (SAM2_i^2 + SAM4_i^2) \\
&= 2\sum_{i=1}^{n/4} ((4\alpha x + (a_i + 2b_i + c_i)\alpha)^2 + (4\alpha x + (b_i + 2c_i + d_i)\alpha)^2) \\
&= 2\sum_{i=1}^{n/4} (((4\alpha x)^2 + 8\alpha^2(a_i + 2b_i + c_i)x + ((a_i + 2b_i + c_i)\alpha)^2) + ((4\alpha x)^2 + 8\alpha^2(b_i + 2c_i + d_i)x + ((b_i + 2c_i + d_i)\alpha)^2)) \\
&= 2\sum_{i=1}^{n/4} (32\alpha^2 x^2 + 8\alpha^2(a_i + 3b_i + 3c_i + d_i)x + ((a_i + 2b_i + c_i)\alpha)^2 + ((b_i + 2c_i + d_i)\alpha)^2) \\
&= \frac{n}{2}(32\alpha^2 x^2 8\alpha^2(A + 3B + 3C + D)x) + 2\sum_{i=1}^{n/4} (((a_i + 2b_i + c_i)\alpha)^2 + ((b_i + 2c_i + d_i)\alpha)^2)
\end{aligned} \quad \text{[Equation 16]}$$

Therefore, [Equation 3] can be transformed and summarized as shown in [Equation 17].

$$\begin{aligned}
\left(\frac{\sigma}{\mu}\right)^2 &= \frac{n}{\left(\sum_{i=1}^{n} SAM_i\right)^2} \cdot \sum_{i=1}^{n} SAM_i^2 - 1 \\
&= \frac{1}{2\alpha^2(-A - B + C + D)^2}(32\alpha^2 x^2 + 8\alpha^2(A + 3B + 3C + D)x + \ldots) - 1
\end{aligned} \quad \text{[Equation 17]}$$

In order to find an offset correction value minimizing [Equation 3], [Equation 17] is differentiated with respect to x, and the coefficient is summarized as K. Then, the following equation is obtained.

$$\frac{d}{dx}\left(\left(\frac{\sigma}{\mu}\right)^2\right) = K(8x + (A + 3B + 3C + D)) \quad \text{[Equation 18]}$$

Therefore, the offset correction value minimizing [Equation 3] can be obtained in [Equation 19] when [Equation 18] is assumed as 0 and solved with respect to x.

$$x = -\frac{1}{8}(A + 3B + 3C + D). \quad \text{[Equation 19]}$$

In addition, with respect to [Equation 3], when a differential value at a certain instant is considered as shown in [Equation 20], it is expressed as follows.

$$\text{Instantaneous differential value of } \left(\frac{\sigma}{\mu}\right)^2 = \quad \text{[Equation 20]}$$
$$K(8x + (a_i + 3b_i + 3c_i + d_i))$$

As shown in [Equation 21], the instantaneous differential value is multiplied by a prescribed, sufficiently small coefficient k, and this resultant value is subtracted from current offset adjustment value $x_i$, to find an updated offset adjustment value $x_{i+1}$. Accordingly, the offset correction value gradually converges to a desired value, and the offset adjustment value can adaptively be controlled even if the direct-current level fluctuates.

$$x_{i+1} = x_i - k(8x_i + (\alpha_i + 3b_i + 3c_i + d_i))$$ [Equation 21]

Moreover, when [Equation 21] is decomposed as shown below, it is convenient in terms of the circuit.

$$x_{i+1} = x_i - k(8x_i + (\alpha_i + 2b_i + c_i) + (b_i + 2c_i + d_i))$$ [Equation 22]

Here, it is assumed that $[u_{i-2} + u_{i-1} + u_i]$ in an example of SAM1 and SAM2 patterns is denoted by $G_i$, and $[u_{i-2} + u_{i-1} + u_i]$ in an example of SAM3 and SAM4 patterns is denoted by $H_i$. Then, $G_i$ and $H_i$ are expressed as in the following.

$$G_i = b_i + 2c_i + d_i,\ H_i = a_i + 2b_i + c_i$$ [Equation 23]

As such, the following equation is given.

$$x_{i+1} = x_i - k(8x_i + H_i + G_i)$$ [Equation 24]

[Offset Correction Value Operating Unit (No. 1)]

Offset correction value operating unit 7 configured in accordance with the above-described algorithm ([Equation 19]) will now be described with reference to FIG. 2.

Figure 2:
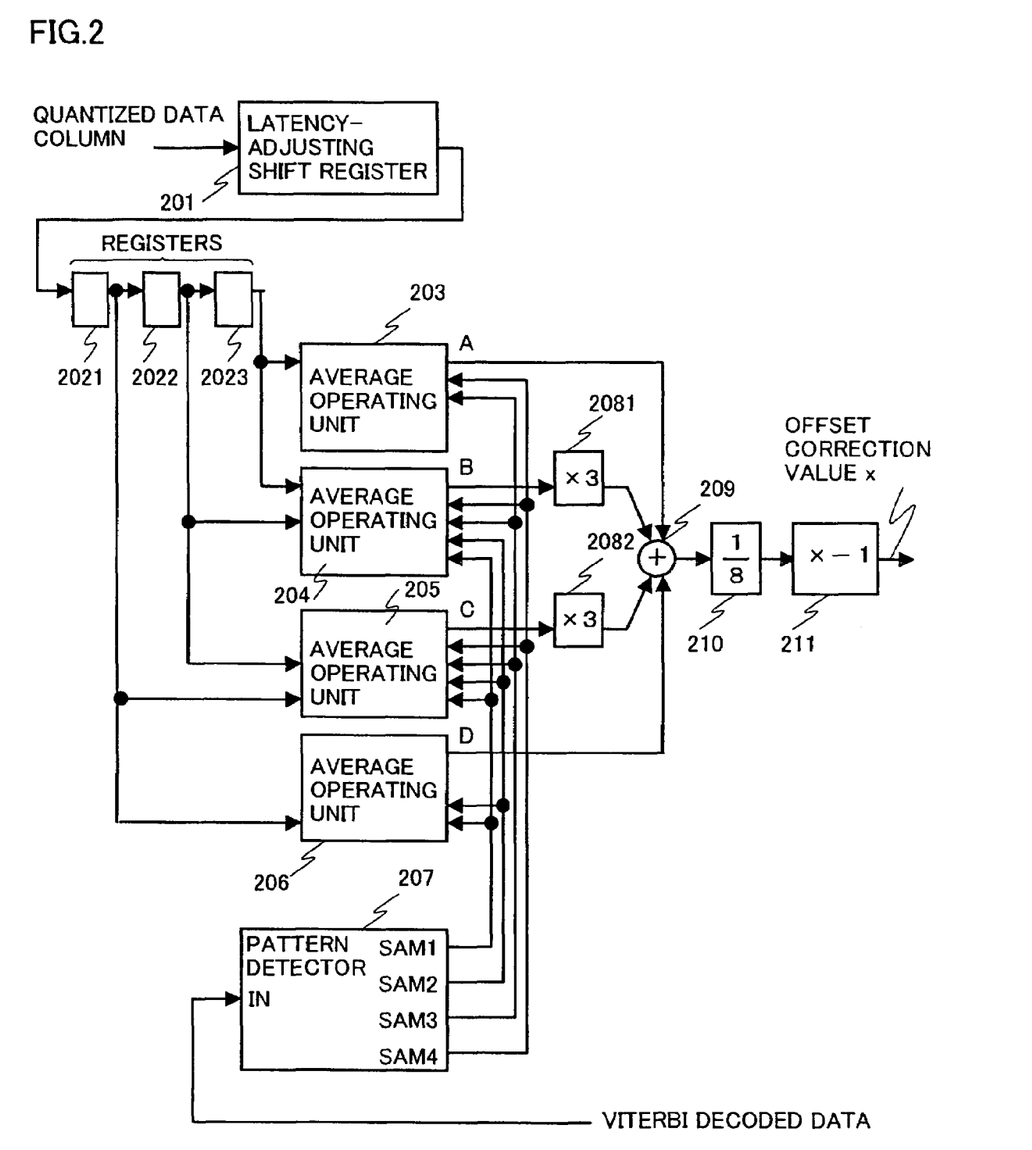
FIG. 2 is a block diagram showing an embodiment of an offset correction value operating unit.

Offset correction value operating unit 7 shown in FIG. 2 is constituted of a latency-adjusting shift register 201, registers 2021, 2022, 2023, a pattern detector 207, average operating units 203, 204, 205, 206, a multiplier 208, an adder 209, a divider 210, and an multiplier 211. These components operate as shown below.

Latency-adjusting shift register 201 has the quantized data column input. Latency-adjusting shift register 201 is constituted of cascaded registers with a prescribed stages, and serves to adjust a timing of the quantized data and decode latency of Viterbi decoder 6. An output of latency-adjusting shift register 201 is input to register 2021. Registers 2021, 2022, 2023 are cascaded as shown, to constitute a shift register. Outputs of registers 2021, 2022, 2023 correspond to $u_i$, $u_{i-1}$, $u_{i-2}$ respectively in algorithm derivation described above.

Pattern detector 207 has the decoded data from Viterbi decoder 6 input, and detects whether the pattern of the decoded data coincides with the correct pattern of SAM1, SAM2, SAM3, or SAM4, or alternatively, it coincides with none of them. If the pattern of the decoded data coincides with any of them, pattern detector 207 outputs 1 to a corresponding output of SAM1, SAM2, SAM3, or SAM4. If it coincides with none of them, pattern detector 207 outputs 0 to all outputs.

Average operating unit 203 is provided so as to operate an average value A of $a_i$ in the above-described algorithm, and monitors the outputs of SAM3, SAM4 of pattern detector 207. When the value of the outputs of SAM3, SAM4 attains 1, average operating unit 203 takes in a value of register 2023, performs operation of the value taken in previously and a moving average, and outputs this result.

Average operating unit 204 is provided so as to operate an average value B of $b_i$ in the above-described algorithm, and monitors the outputs of SAM1, SAM2, SAM3, SAM4 of pattern detector 207. When the value of SAM1, SAM2 attains 1, average operating unit 204 takes in the value of register 2023, and when the value of SAM3, SAM4 attains 1, average operating unit 204 takes in a value of register 2022. Then, average operating unit 204 performs operation of the value taken in previously and a moving average, and outputs this result.

Average operating unit 205 is provided so as to operate an average value C of $c_i$ in the above-described algorithm, and monitors the outputs of SAM1, SAM2, SAM3, SAM4 of pattern detector 207. When the value of SAM1, SAM2 attains 1, average operating unit 205 takes in the value of register 2022, and when the value of SAM3, SAM4 attains 1, average operating unit 205 takes in a value of register 2021. Then, average operating unit 205 performs operation of the value taken in previously and a moving average, and outputs this result.

Average operating unit 206 is provided so as to operate an average value D of $d_i$ in the above-described algorithm, and monitors the outputs of SAM1, SAM2 of pattern detector 207. When the value of the outputs of SAM1, SAM2 attains 1, average operating unit 206 takes in a value of register 2021, performs operation of the value taken in previously and a moving average, and outputs this result.

An output of average operating unit 204 is input to a multiplier 2081 where the output is multiplied by 3. An output of average operating unit 205 is input to a multiplier 2082 where the output is multiplied by 3.

An output of average operating unit 203, an output of multiplier 2081, an output of multiplier 2082, and an output of average operating unit 206 are input to adder 209, where all these outputs are added.

An output of adder 209 is input to divider 210, which multiplies the input data by ⅛ for output. The output of divider 210 is input to multiplier 211, which multiplies the output by −1 to invert the sign.

With the above-described configuration, the operation shown in [Equation 19] is performed, and this value is added to the quantized data column as the offset correction value attaining a substantially best error rate.

[Offset Correction Value Operating Unit (No. 2)]

Offset correction value operating unit 7 configured in accordance with the above-described algorithm ([Equation 24]) will now be described with reference to FIG. 3.

Figure 3:
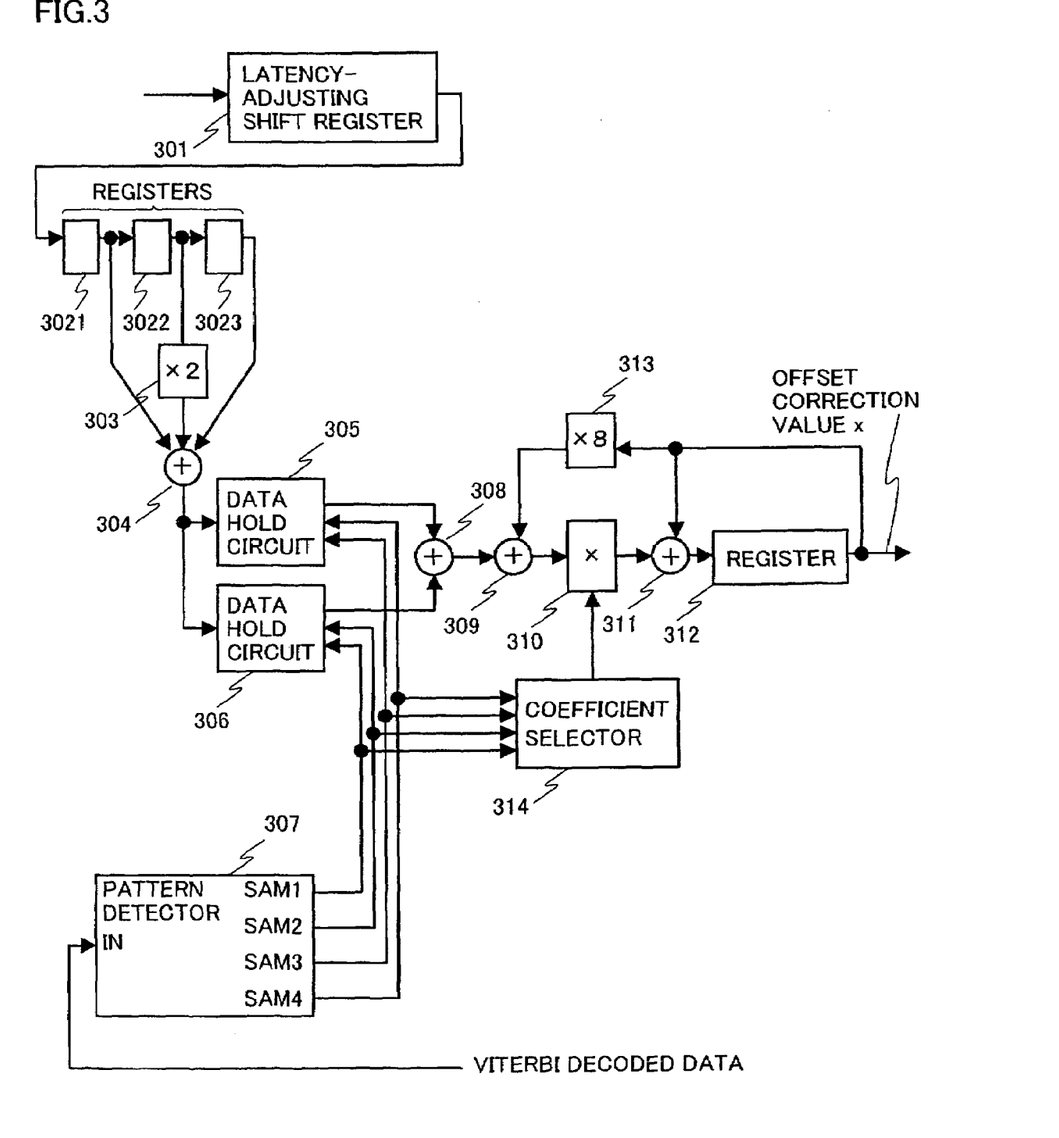
FIG. 3 is a block diagram showing another embodiment of an offset correction value operating unit.

Offset correction value operating unit 7 shown in FIG. 3 is constituted of a latency-adjusting shift register 301, registers 3021, 3022, 3023, a pattern detector 307, a multiplier 303, an adder 304, data hold circuits 305, 306, adders 308, 309, 311, a multiplier 310, a register 312, a multiplier 313, and a coefficient selector 314. These components operate as shown below.

Latency-adjusting shift register 301 has the quantized data column input. Latency-adjusting shift register 301 is constituted of cascaded registers with a prescribed stages, and serves to adjust a timing of the quantized data and decode latency of Viterbi decoder 6. An output of latency-adjusting shift register 301 is input to register 3021. Registers 3021, 3022, 3023 are cascaded as shown, to constitute a shift register. Outputs of registers 3021, 3022, 3023 correspond to $u_i$, $u_{i-1}$, $u_{i-2}$ respectively in algorithm derivation described above.

Pattern detector 307 has the decoded data from Viterbi decoder 6 input, and detects whether the pattern of the decoded data coincides with the correct pattern of SAM1, SAM2, SAM3, or SAM4, or alternatively, it coincides with none of them. If the pattern of the decoded data coincides with any of them, pattern detector 307 outputs 1 to a corresponding output of SAM1, SAM2, SAM3, or SAM4. If it coincides with none of them, pattern detector 207 outputs 0 to all outputs.

Registers 3021, 3022, 3023 are connected to multiplier 303 performing multiplication-by-2 operation and adder 304 as shown. An output of adder 304 corresponds to $[u_i + 2u_{i-1} + u_{i-2}]$ in the above-described algorithm derivation.

Data hold circuit 305 is provided so as to hold $[H_i = a_i + 2b_i + c_i]$ in the above-described algorithm, and monitors the outputs of SAM3, SAM4 of pattern detector 307. When the value of the outputs of SAM3, SAM4 attains 1, data hold circuit 305 takes in and holds a value of adder 304. When the outputs of SAM3, SAM4 attain 0, data hold circuit 305 continues to hold the value taken in previously.

Data hold circuit 306 is provided so as to hold [$G_i=b_i+2c_i+d_i$] in the above-described algorithm, and monitors the outputs of SAM1, SAM2 of pattern detector 307. When the value of the outputs of SAM1, SAM2 attains 1, data hold circuit 306 takes in and holds a value of adder 304. When the outputs of SAM1, SAM2 attain 0, data hold circuit 306 continues to hold the value taken in previously.

Outputs of hold circuits 305, 306 are added by adder 308 and output to adder 309. As shown, adder 309 adds to the output of adder 308, a value obtained by multiplying the current offset correction value held in register 312 by 8 with multiplier 313 (8× in [Equation 24]). An output of adder 309 is multiplied by an output of coefficient selector 314 with multiplier 310.

When pattern detector 307 outputs 0, that is, when the pattern of decoded data coincides with none of the patterns of SAM1, SAM2, SAM3, and SAM4, coefficient selector 314 outputs 0. On the other hand, when the pattern of decoded data coincides with any of them, coefficient selector 314 outputs a prescribed constant k. Adder 311 adds an output of multiplier 310 to the current offset correction value held in register 312. An output of adder 311 becomes equivalent to the right side of [Equation 22] and updates register 312.

With the above-described configuration, the operation shown in [Equation 24] is performed, and this value is added to the quantized data column as the offset correction value attaining a substantially best error rate.

Second Embodiment

Figure 4:
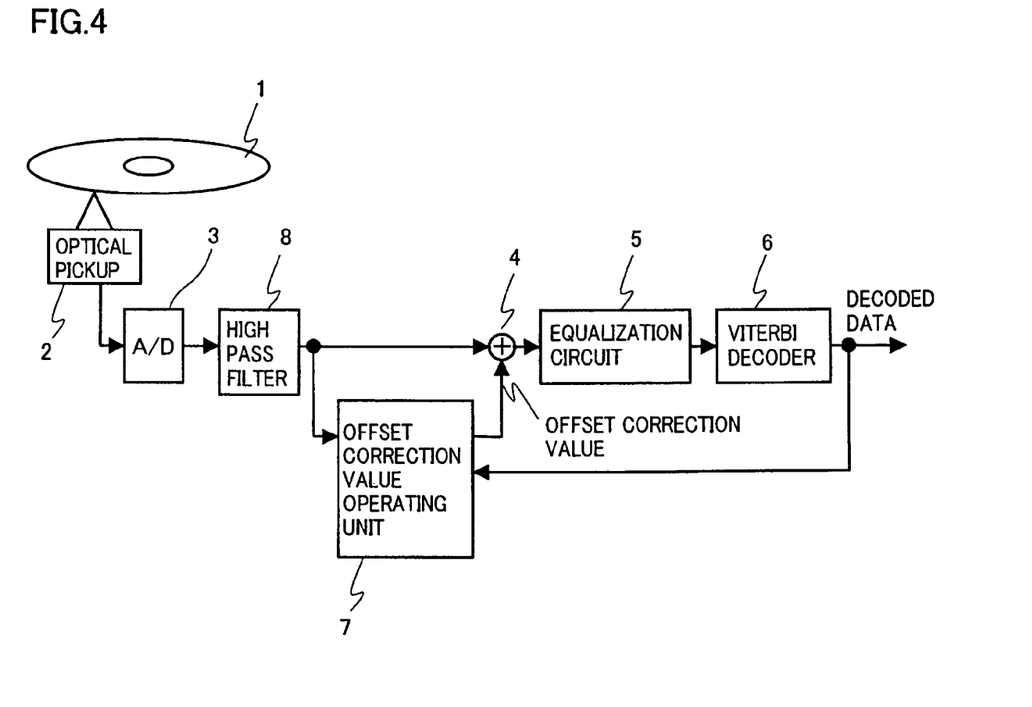
FIG. 4 is a block diagram showing another embodiment of the present invention.

In the following, a second embodiment of the present invention will be described with reference to the figures. Though the second embodiment is substantially the same as the first embodiment as shown in FIG. 4, it is characterized in that a high pass filter 8 is provided in a preceding stage of offset correction value operating unit 7 and adder 4 for offset correction.

The reproduction signal of the optical disc contains considerable noise of low frequency caused by reflectivity fluctuation, sensitivity variation of the recording medium, or the like. Since such low-frequency noise tends to cause a decode error, it is desirable to remove the noise as much as possible with a high pass filter.

On the other hand, the bandwidth of the low frequency noise exhibits a crossover with a low-frequency component in the recording, code such as (d, k) RLL code+NRZI conversion. Accordingly, if the low frequency is carelessly removed with the high pass filter, an essential "low-frequency component of the recording code" may be lost, resulting in an increase in the decode error.

Here, the apparatus for correcting offset according to the present invention is expected to operate so as to compensate the lost, low-frequency component in the code solely by the design paying some attention to the constant or the like, as described below.

In offset correction value operating unit 7 shown in FIG. 2, average operating circuits 203, 204, 205, 206 operate the moving average. Here, as the moving average is one sort of FIR-type digital filters, this filter property is associated with the property of high pass filter 8. Specifically, attention is paid to for how long span of time the average should be taken, that is, from a present time point back to a time point somewhere in the past. Then, a desired filter bandwidth is designed, and a control bandwidth in an offset correction operation is set to be equal to or higher than the bandwidth cut by high pass filter 8.

Alternatively, in offset correction value operating unit 7 shown in FIG. 3, constant k output by coefficient selector 314 is appropriately selected, and a control bandwidth in an offset correction operation is set to be equal to or higher than the bandwidth cut by high pass filter 8.

With such a design, offset is corrected so as to compensate the low-frequency component of a code lost by high pass filter 8. Accordingly, an operation as if solely the low-frequency noise component had been removed can be achieved, and a decode error can further be decreased.

In the present embodiment, though high pass filter 8 has been shown as a digital filter provided in a subsequent stage of AD converter 3, it may be an analog filter provided in a preceding stage thereof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for correcting offset, comprising:
    offset adjustment means for adding an offset adjustment amount to an input signal;
    Viterbi decoding means for subjecting the input signal to Viterbi decoding for binarization after offset adjustment is performed by said offset adjustment means; and
    calculating means, being connected to said offset adjustment means and said Viterbi decoding means, for calculating an offset adjustment amount so that a value, that is obtained by dividing a standard deviation of path metric difference between a survivor path in said Viterbi decoding means and another path merged into said survivor path by an average of said path metric difference, is minimized.

2. The apparatus for correcting offset according to claim 1, wherein
    said calculating means includes means for calculating an offset adjustment amount by subtracting a calculated value from a current offset adjustment amount, the current value being obtained by multiplying a prescribed coefficient with an instantaneous differential value of the value obtained by dividing the standard deviation of path metric difference between said survivor path and said another path by the average of said path metric difference.

3. The apparatus for correcting offset according to claim 2, wherein
    a recording code of an original bit column of said input signal has a minimum inversion interval of at least 2, a ratio of impulse response of an isolated mark assumed by said Viterbi decoding means is set to (1:2:1), and an expected value of said Viterbi decoding means is set to $-\alpha$, $-0.5\alpha$, $+0.5\alpha$, $+\alpha$ assuming $\alpha$ as a prescribed constant, and
    when current input data, input data preceding by 1 sample, and input data preceding by 2 samples are denoted by $y_i$, $y_{i-1}$, $y_{i-2}$ respectively, the path metric difference between said survivor path and said another path is calculated by $\pm\alpha(y_{i-2}+2y_{i-1}+y_i)$.

4. The apparatus for correcting offset according to claim 3, wherein
    said calculating means includes means for calculating said offset adjustment amount so as to satisfy $x_{i+1}=x_i-k$ (8x$_i$+a+3b+3c+d), where a current adjustment amount, an adjustment amount after adjustment, a latest input signal corresponding to Viterbi decoding expected value −α, a latest input signal corresponding to −0.5α, a latest input signal corresponding to +0.5α, a latest input signal corresponding to +α, and a prescribed constant are denoted by x$_i$, x$_{i+1}$, a, b, c, d, and k respectively.

5. The apparatus for correcting offset according to claim 3, further comprising a low frequency cutoff filter connected to a preceding stage of said offset adjustment means.

6. The apparatus for correcting offset according to claim 2, wherein
said calculating means includes means for calculating said offset adjustment amount so as to satisfy x$_{i+1}$=x$_i$−k(8x$_i$+a+3b+3c+d), where a current adjustment amount, an adjustment amount after adjustment, a latest input signal corresponding to Viterbi decoding expected value −α, a latest input signal corresponding to −0.5α, a latest input signal corresponding to +0.5α, a latest input signal corresponding to +α, and a prescribed constant are denoted by x$_i$, x$_{i+1}$, a, b, c, d, and k respectively.

7. The apparatus for correcting offset according to claim 1, wherein
a recording code of an original bit column of said input signal has a minimum inversion interval of at least 2, a ratio of impulse response of an isolated mark assumed by said Viterbi decoding means is set to (1:2:1), and an expected value of said Viterbi decoding means is set to −α, −0.5α, +0.5α, +α assuming α as a prescribed constant, and
when current input data, input data preceding by 1 sample, and input data preceding by 2 samples are denoted by y$_i$, y$_{i−1}$, y$_{i−2}$ respectively, the path metric difference between said survivor path and said another path is calculated by ±α(y$_{i−2}$+2y$_{i−1}$+y$_i$).

8. The apparatus for correcting offset according to claim 7, wherein
said calculating means includes means for calculating said offset adjustment amount so as to satisfy x$_{i+1}$=x$_i$−k(8x$_i$+a+3b+3c+d), where a current adjustment amount, an adjustment amount after adjustment, a latest input signal corresponding to Viterbi decoding expected value −α, a latest input signal corresponding to −0.5α, a latest input signal corresponding to +0.5α, a latest input signal corresponding to +α, and a prescribed constant are denoted by x$_i$, x$_{i+1}$, a, b, c, d, and k respectively.

9. The apparatus for correcting offset according to claim 7, further comprising a low frequency cutoff filter connected to a preceding stage of said offset adjustment means.

10. The apparatus for correcting offset according to claim 1, wherein
said calculating means includes means for calculating said offset adjustment amount so as to satisfy x$_{i+1}$=x$_i$−k(8x$_i$+a+3b+3c+d), where a current adjustment amount, an adjustment amount after adjustment, a latest input signal corresponding to Viterbi decoding expected value −α, a latest input signal corresponding to −0.5α, a latest input signal corresponding to +0.5α, a latest input signal corresponding to +α, and a prescribed constant are denoted by x$_i$, x$_{i+1}$, a, b, c, d, and k respectively.

11. The apparatus for correcting offset according to claim 1, wherein said calculating means includes means for calculating said offset adjustment amount so as to satisfy x=−(A+3B+3C+D)/8, where an adjustment amount, an input signal corresponding to Viterbi decoding expected value −α after passing through a high frequency cutoff filter, an input signal corresponding to −0.5α after passing through a high frequency cutoff filter, an input signal corresponding to +0.5α after passing through a high frequency cutoff filter, and an input signal corresponding to +α after passing through a high frequency cutoff filter are denoted by x, A, B, C, and D respectively.

12. A method of correcting offset, comprising the steps of:
adjusting offset by adding an offset adjustment amount to an input signal;
performing Viterbi decoding on the input signal after offset adjustment in said offset adjustment step for binarization; and
calculating an offset adjustment amount so as to minimize a value that is obtained by dividing a standard deviation of path metric difference between a survivor path in said Viterbi decoding step and another path merged into said survivor path by an average of said path metric difference.

13. The method of correcting offset according to claim 12, wherein
said calculating step includes the step of calculating an offset adjustment amount by subtracting, from a current offset adjustment amount, a calculated value obtained by multiplying a prescribed coefficient with an instantaneous differential value of the value obtained by dividing the standard deviation of path metric difference between said survivor path and said another path by the average of said path metric difference.

14. The method of correcting offset according to claim 13, wherein
a recording code of an original bit column of said input signal has a minimum inversion interval of at least 2, a ratio of impulse response of an isolated mark assumed in said Viterbi decoding step is set to (1:2:1), and an expected value in said Viterbi decoding step is set to −α, −0.5α, +0.5α, +α assuming α as a prescribed constant, and
when current input data, input data preceding by 1 sample, and input data preceding by 2 samples are denoted by y$_i$, y$_{i−1}$, y$_{i−2}$ respectively, the path metric difference between said survivor path and said another path is calculated by ±α(y$_{i−2}$+2y$_{i−1}$+y$_i$).

15. The method of correcting offset according to claim 14, wherein
said calculating step includes the step of calculating said offset adjustment amount so as to satisfy x$_{i+1}$=x$_i$−k(8x$_i$+a+3b+3c+d), where a current adjustment amount, an adjustment amount after adjustment, a latest input signal corresponding to Viterbi decoding expected value −α, a latest input signal corresponding to −0.5α, a latest input signal corresponding to +0.5α, a latest input signal corresponding to +α, and a prescribed constant are denoted by x$_i$, x$_{i+1}$, a, b, c, d, and k respectively.

16. The method of correcting offset according to claim 13, wherein
said calculating step includes the step of calculating said offset adjustment amount so as to satisfy x$_{i+1}$=x$_i$−k(8x$_i$+a+3b+3c+d), where a current adjustment amount, an adjustment amount after adjustment, a latest input signal corresponding to Viterbi decoding expected value −α, a latest input signal corresponding to −0.5α, a latest input signal corresponding to +0.5 α, a latest input signal corresponding to +α, and a prescribed constant are denoted by $x_i$, $x_{i+1}$, a, b, c, d, and k respectively.

17. The method of correcting offset according to claim 12, wherein a recording code of an original bit column of said input signal has a minimum inversion interval of at least 2, a ratio of impulse response of an isolated mark assumed in said Viterbi decoding step is set to (1:2:1), and an expected value in said Viterbi decoding step is set to −α, −0.5α, +0.5α, +α assuming α as a prescribed constant, and when current input data, input data preceding by 1 sample, and input data preceding by 2 samples are denoted by $y_i$, $y_{i-1}$, $y_{i-2}$ respectively, the path metric difference between said survivor path and said another path is calculated by $\pm\alpha(y_{i-2}+2y_{i-1}+y_i)$.

18. The method of correcting offset according to claim 17, wherein said calculating step includes the step of calculating said offset adjustment amount so as to satisfy $x_{i+1}=x_i-k(8x_i+a+3b+3c+d)$, where a current adjustment amount, an adjustment amount after adjustment, a latest input signal corresponding to Viterbi decoding expected value −α, a latest input signal corresponding to −0.5α, a latest input signal corresponding to +0.5α, a latest input signal corresponding to +α, and a prescribed constant are denoted by $x_i$, $x_{i+1}$, a, b, c, d, and k respectively.

19. The method of correcting offset according to claim 12, wherein said calculating step includes the step of calculating said offset adjustment amount so as to satisfy $x_{+1}=x_i-k(8x_i+a+3b+3c+d)$, where a current adjustment amount, an adjustment amount after adjustment, a latest input signal corresponding to Viterbi decoding expected value −α, a latest input signal corresponding to −0.5α, a latest input signal corresponding to +0.5α, a latest input signal corresponding to +α, and a prescribed constant are denoted by $x_i$, $x_{i+1}$, a, b, c, d, and k respectively.

20. The method of correcting offset according to claim 12, wherein said calculating step includes the step of calculating said offset adjustment amount so as to satisfy $x=-(A+3B+3C+D)/8$, where an adjustment amount, an input signal corresponding to Viterbi decoding expected value −α after passing through a high frequency cutoff filter, an input signal corresponding to −0.5α after passing through a high frequency cutoff filter, an input signal corresponding to +0.5α after passing through a high frequency cutoff filter, and an input signal corresponding to +α after passing through a high frequency cutoff filter are denoted by x, A, B, C, and D respectively.

* * * * *